United States Patent [19]

Simms

[11] 4,242,874
[45] Jan. 6, 1981

[54] ICEBOX CONVERSION UNIT

[76] Inventor: Larry L. Simms, P.O. Box 1083, San Pedro, Calif. 90733

[21] Appl. No.: 968,502

[22] Filed: Dec. 11, 1978

[51] Int. Cl.³ ............................ F25B 21/02; F25D 3/08
[52] U.S. Cl. ............................................. 62/3; 62/457
[58] Field of Search ............................. 62/3, 453, 457

[56] References Cited

U.S. PATENT DOCUMENTS

| 3,821,881 | 7/1974 | Harkias | 62/3 |
| 4,007,600 | 2/1977 | Simms | 62/457 |

Primary Examiner—Lloyd L. King
Attorney, Agent, or Firm—Lewis B. Sternfels

[57] ABSTRACT

A thermoelectric icebox conversion unit features a cold plate (22) which incorporates bosses (24) and radially extending heat-collecting fins (23), all diecast as one integral unit which avoids sharp corners and joints, thereby decreasing resistance to thermal conductivity. The cold plate serves as the base for the unit and as the means for mounting the unit in an insulated enclosure. Thermoelectric modules (25) are attached to bosses (24). Thermal insulation (32) retained by a separator (31) is enclosed in the space between a heat sink plate (26) and the cold plate. A fan (34) and power supply is mounted on the separator and is attached to the cold plate. A cover (35) encloses the fan, power supply and heat-radiating fins (27) and has openings for circulation of air. A second fan assembly (41) is mounted within the cold plate fins (23), and a baffle plate (42) with openings is placed over the fins and the fan for circulating refrigerated air past the fins (23) as well as within the insulated enclosure.

4 Claims, 11 Drawing Figures

ICEBOX CONVERSION UNIT

REFERENCE TO RELATED APPLICATIONS

The present application is an improvement of my invention described in U.S. Pat. No. 4,007,600 issued Feb. 15, 1977, entitled ICEBOX CONVERSION UNIT.

FIELD OF THE INVENTION

This invention relates to refrigeration apparatus and, more specifically, to a compact, self-contained thermoelectric refrigeration unit with improved thermal efficiency for converting an existing insulated enclosure into an electric refrigerator.

BACKGROUND OF THE INVENTION

Thermally insulated iceboxes or ice chests for preserving food find use for picnics and outings in trailers and campers, and aboard boats and airplanes. It is sometimes desirable to replace these iceboxes with electrical refrigerators but, due to space or cost limitations, this is not always feasible. Generally, aboard a boat the iceboxes are built-in and an integral part of the galley, and there is insufficient space to add a refrigerator. Even if the icebox could be removed, a refrigerator generally would not fit in the space formerly occupied by the icebox because, for example, boats are not rectangular and do not have square corners. Thus, the icebox may have a curved back wall at the lower corners, whereas refrigerators are generally rectangular and have square corners. For this reason, refrigerators have sometimes been strapped into bunks, taking up needed bed space.

One alternative is to convert the icebox to a compressor type refrigerator. However, these are expensive and complex. A better alternative is to convert the icebox to a refrigerator by installing the cooling unit from a thermoelectric refrigerator. However, these are not always adaptable to easy and convenient installation into any given insulated enclosure. U.S. Pat. No. 3,412,566 shows a refrigerator cooled by a thermoelectric unit, but the thermoelectric unit is built as an integral part of the refrigerator. The inner wall of the refrigerator itself serves as the cold plate, and the components of the thermoelectric unit are assembled into the wall of the refrigerator at the time the refrigerator is built. After the elements are assembled into the wall, the space within the wall is filled with insulation.

Similarly, U.S. Pat. No. 3,821,881 shows a refrigerator having a thermoelectric unit built into the door. The door is of a special shape and configuration, and the components of the thermoelectric unit are assembled into the door at the time it is built, and tightening the assembly effectively clamps the unit into the door. Clearly, such cooling units do not lend themselves to easy installation in an existing insulated enclosure because they are not constructed as fully-assembled, compact, self-contained units which will mount easily in a proper size hole made in any insulated enclosure.

In my above-mentioned U.S. Pat. No. 4,007,600, I described a thermoelectric refrigeration unit which is simple, compact, and self-contained, and in which the entire unit is easily fastened into a hole made in an existing insulated enclosure. The refrigeration unit is relatively inexpensive to install and economical to operate and will operate with any available source AC or DC. Furthermore, the refrigeration unit operates silently, is not sensitive to motion, is light in weight, and can be mounted on the top, bottom, or any side of an existing enclosure because it does not require that any particular side be maintained in an upright position. While a decided improvement over the prior art, it was found that still further improvements could be made. For example, it is constructed of a multiplicity of elements and connecting hardware which adds to its weight and cost. Assembly requires a moderate degree of skill in the factory with some likelihood of rejects. In addition, the existence of several parts decreases its thermal efficiency because the heat must be conducted through a multiplicity of thermal junctions with sharp corners, both of which offer resistance to thermal conductivity.

SUMMARY OF THE INVENTION

The present invention overcomes and avoids these and other problems primarily by use of a unitary cold plate which incorporates integral thermoelectric module mounting bosses and heat collecting, radially extending fins, both blending into the cold plate at curved junctions. A baffle plate with central louvers is mounted over the radially extending fins so that refrigerated air can be circulated past the fins as well as throughout the insulated enclosure.

More specifically, the cold plate and its attachments are contained within a compact, self-contained refrigeration unit comprising a thermoelectric assembly, power supply, and fan, all mounted in a case which may be conveniently fastened into a hole in any existing thermally insulated enclosure. The cold plate of the thermoelectric assembly further serves as the mounting means for the entire unit. An intermediate separator fits over most of the thermoelectric assembly and contains thermal insulating material that insulates the cold plate from the heatsink plate. The power supply and the fan are mounted in the separator, and a cover fits over all, nesting over the separator. The separator and cover have flanges which are fastened to the cold plate, and the cover has openings to permit the fan to circulate air over the heat-radiating fins. A second fan circulates the refrigerated air within the insulated enclosure.

It is, therefore, an object of the present invention to provide for a thermoelectric refrigeration unit having improved thermal efficiency.

Another object is to provide for such a unit which is less costly than heretofore in its manufacture and assembly.

A further object is to provide for such a unit requiring less skill than before to assemble or manufacture it.

Still another object is to provide for such a unit which requires fewer parts, thereby decreasing the likelihood of manufacturing error and rejects.

Yet another object is to provide for a decrease in the number of thermal junctions and other resistance to streamlined flow of heat.

These and other objects and features of the present invention can be more readily understood with reference to the following detailed description, taken in conjunction with the accompanying drawings, wherein like reference numerals designate like structural elements.

DETAILED DESCRIPTION OF THE INVENTION

Figure 1:
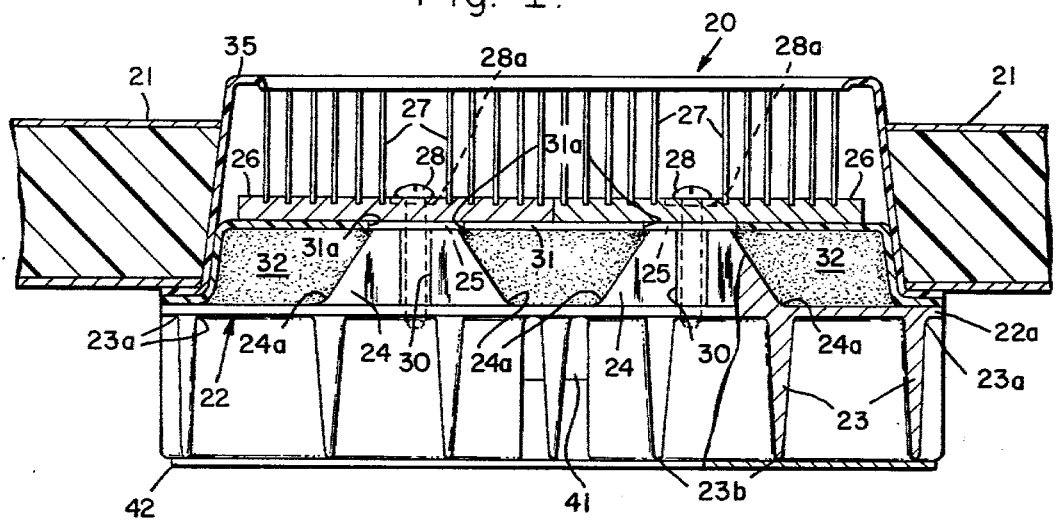
FIG. 1 is a view in partial cross-section taken from the top of the refrigeration unit of the present invention, as mounted in an insulated enclosure.

Referring now to the drawings, FIG. 1 is a side view, partly in cross section, of an embodiment of an improved icebox conversion unit 20 constructed in accordance with the present invention. It is shown mounted in a hole provided in the wall of a thermally insulated enclosure 21. A cold plate 22 serves as a base for the icebox conversion unit 20 and as the means for mounting the icebox conversion unit 20 in the wall of the insulated enclosure 21.

Figure 3:
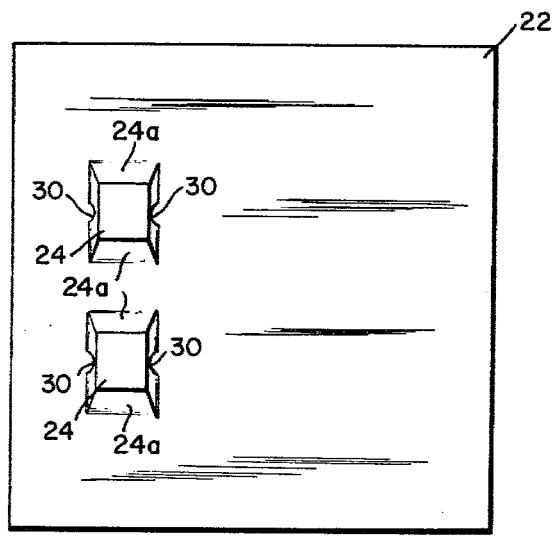
FIG. 3 is a front view of the cold plate shown in FIG. 1.

The cold plate 22 is a generally rectangular plate which may be made of heavy cast aluminum or other highly thermally conductive metal, and it is cast or otherwise formed as an integral, unitary part with a plurality of radially extending fins 23 on one side, and two bosses 24 on the other side. The fins 23 are best seen in FIG. 5, and the bosses 24 in FIG. 3. As shown in FIG. 5, a generally circular space is formed at the inner ends 23c of the fins 23 for placement of a fan 41. The inner ends 23c are relieved (see also FIG. 4) for passage of the blades of the fan 41. Two thermoelectric modules 25 are disposed between planar outer surfaces of the bosses 24, and contact a pair of side-by-side rectangular heat sink plates 26. The thermoelectric modules 25 may be cemented to the heat sink plates 26 with a thermally conductive epoxy cement such as Stycast 2580KT or Stycast 2850FT. A thin continuous film of a thermally conductive compound, such as thermal grease identified as Wakefield Engineering type 120 or Dow type 340, may be disposed between the thermoelectric modules 25 and the bosses 24 to make good thermally conductive joints between the thermoelectric modules 25 and the cold plate 22.

Figure 2:
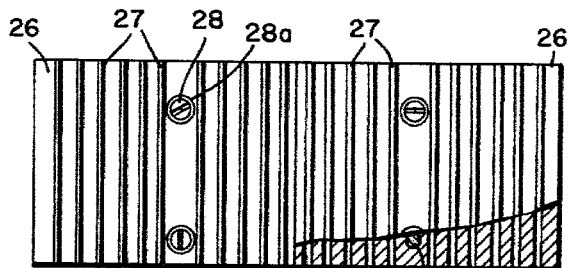
FIG. 2 is a front view of the external heat radiating fins of FIG. 1.

Referring now to FIG. 2, taken in conjunction with FIG. 1, the heat sink plates 26 are provided with heat radiating fins 27. These heat radiating fins 27 may be made of aluminum or other thermally conductive material and may be fastened to the heat sink plates 26 by any conventional means that makes a good thermally conductive joint, for example by use of the thermally conductive epoxy referred to previously. The heat sink plates 26 may be made of a highly thermally conductive metal, for example aluminum, and may be copper plated, particularly if it should be desired to solder the thermoelectric modules 25 to the heat sink plates 26.

The thermoelectric modules 25 are compressed between the cold plate 22 and the heat sink plates 26 by means of screws 28. The heads of the screws 28 are at the surface of the heat sink plates 26, and the screws 28 may be provided with thermally-insulating fiber washers and lock washers (not shown) placed within recesses 28a. The cold plate 22 is provided with threaded holes 29 to receive the other end of the screws 28, which pass through clearance holes in the heat sink plates 26. The screws 28 may be tightened with a torque wrench in order to provide the proper amount of compression so that the modules 25 can make good thermal contact on one side with the heat sink plates 26, and on the other side with the bosses 24 on the cold plate 22. Two separate but adjacent heat sink plates 26 are used instead of one integral plate so that good thermally conductive joints may be obtained without having the planar tops of the bosses 24 precisely parallel. The bosses 24 are provided with relief grooves 30 (see also FIG. 3) along the sides for passage of the screws 28.

An intermediate separator 31 of dished configuration has a flange around its perimeter which contacts the edge of the cold plate 22. The separator 31 passes beneath the heat sink plates 26 and has openings 31a to accommodate the thermoelectric modules 25. The separator 31 may be made of vacuum formed plastic. The space between the separator 31 and the cold plate 22 is filled with a thermal insulating material 32 which may be pour-in-place foam such as a freon-blown polyurethane foam of about 1½ pounds density. Pour-in-place insulation is preferred because it enables moisture bearing air and any condensation therefrom to be excluded from the back side of the cold plate 22, which would otherwise cause a thermal and electrical short circuit.

The sides of the bosses 24 are tapered from a relatively small dimension adjacent the modules 25 to a larger dimension where they join with the cold plate 22. The junction with the cold plate 22 is curved gradually at 24a so that the bosses 24 meld or merge into the cold plate 22 without a sharp thermal discontinuity in the heat path, to assure a more efficient thermal flow.

Figure 4:
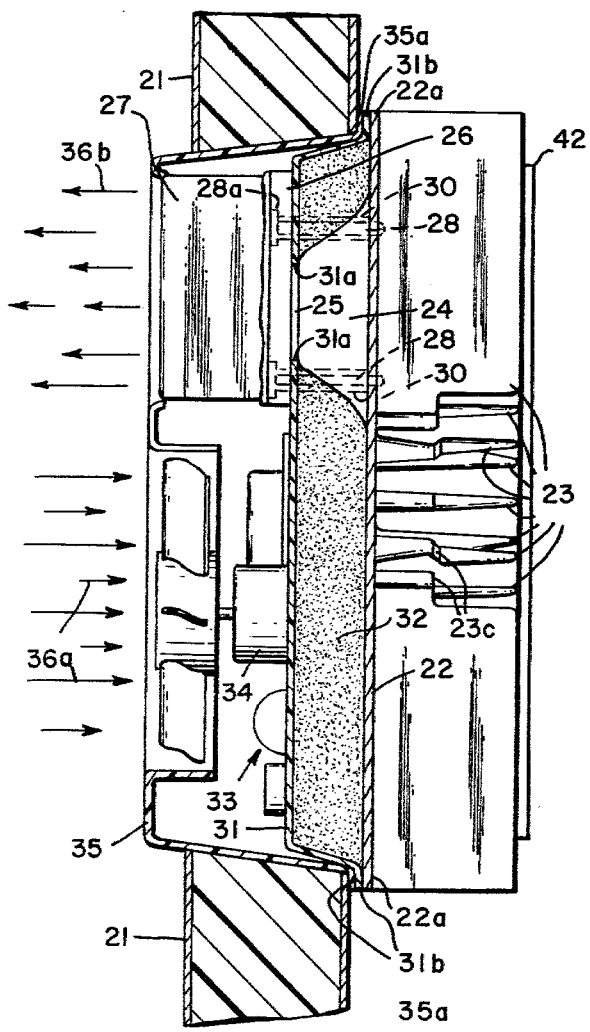
FIG. 4 is a cross-sectional side view of the refrigerator unit of FIG. 1 with the cold plate fan removed, taken along lines 4—4 of FIG. 5.
Figure 5:
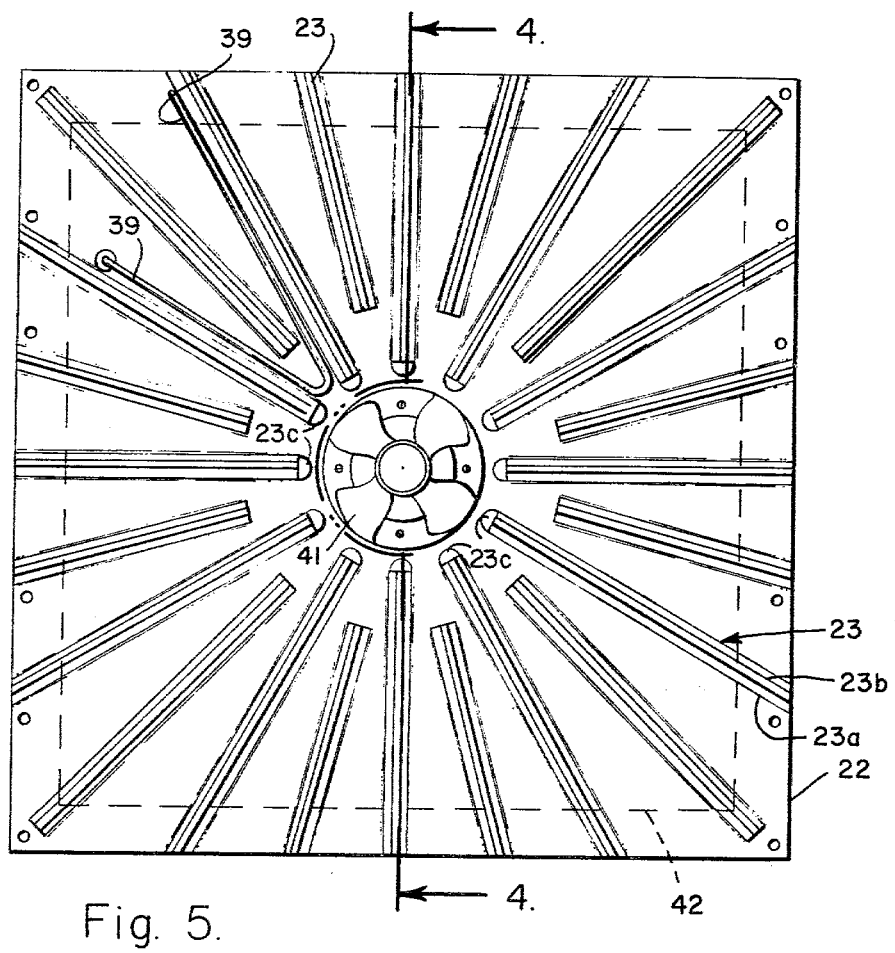
FIG. 5 is a rear view of the refrigeration unit looking towards the fin side of the cold plate shown in FIG. 3, and with the baffle plate (in dashed lines) removed.

The intermediate separator 31 has a power supply 33 and a fan 34 fastened to its outer surface (FIG. 4). A cover 35, which may also be made of vacuum formed plastic, encloses the space containing the power supply 33, the fan 34 and the heat radiating fins 27. The cover 35 is provided with openings for the passage of air which enters at the fan 34 as shown by arrows 36a, and exits in the region of the heat radiating fins 27, as indicated by the arrows 36b.

The cover 35 is of a dished configuration and nests over the separator 31. It has a flange 35a in contact with the flange 31b of the separator 31, and the whole assembly is fastened together by any suitable means, such as rivets, which fasten the flanges 31b of the separator 31 and cover 35 to the margin 22a of the cold plate 22.

The controls and switches, which are not shown in the illustrations of this embodiment, are mounted to the cover 35. A protective thermostat, also not shown, is mounted to the heat sink plates 26 and disposed between the modules 25. The temperature control thermostat is provided with a capillary tube 39 (see FIG. 5) which passes through the assembly and contacts the cold plate 22.

Referring again to FIG. 5, the fins 23 of the cold plate 22 function as thermal collectors or heat absorbing ribs. The fins 23 or heat absorbing ribs are disposed on the surface of the cold plate 22 and radiate outwardly from the center of the cold plate. As many fins 23 as is possible and consistent with efficient air flow are used, and some of the fins may be made shorter than others to facilitate the air flow. The fins 23 which extend toward the corners 20 of the cold plate 22 are shortened at the outer ends to leave room for rivet holes. The fins 23 are of a generally elongated triangular configuration as best seen in FIG. 1, although they are provided with a radius 23a where they join with the cold plate 22, and also a radius 23b at their outer apex to provide thermal efficiency and economy of manufacture.

The cold plate 22, the fins 23 and the bosses 24 are diecast or otherwise fabricated as one integral unit, whereas most conventional thermoelectric refrigeration units employ individual components as elements of the cold plate assembly and in the thermal conductive path to the thermoelectric modules. The multiplicity of thermal junctions or interfaces in this type of assembly resists flow of heat and degrades the thermal efficiency. In addition, it increases the cost of assembly, and the total cost of the components which make up the assembly is higher.

The icebox conversion unit 20 of the present invention employing the improved cold plate 22 eliminates many thermal junctions with their attendant thermal inefficiency. Another feature of its more efficient thermal design is the use of the radii 24a and 23a, respectively at the bases of the bosses 24 and the fins 23, which would be difficult to efficiently provide in a unit employing many individual components as a part of the assembly. Hence, the icebox conversion unit 20 of the present invention can be made for less cost, provides higher efficiency, requires less skill in manufacturing assembly, is made of fewer parts, and has less rejects at assembly. Furthermore, the present icebox conversion unit 20 is lighter in weight. Because of the elimination of superfluous thermal junctions or interfaces, the improved unit 20 of the present invention is also more reliable.

Figure 6:
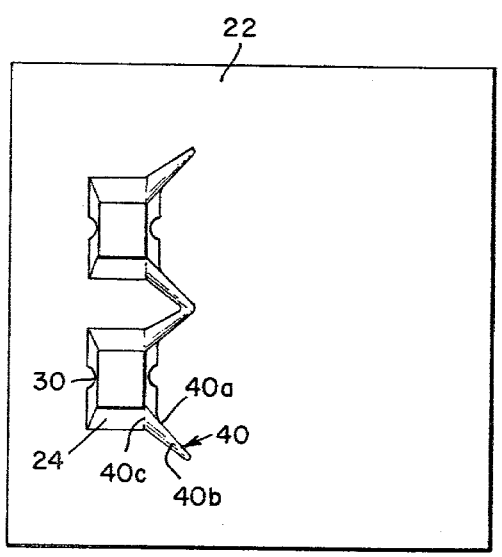
FIG. 6 is a front view of a modified cold plate, similar to that depicted in FIG. 3, for enhancing the transfer or conduction of heat from the cold plate.

In a modification shown in FIG. 6, the bosses 24 may also be provided with thermal transfer ribs 40. The thermal transfer ribs 40 collect heat from areas of the cold plate 22 distant from the bosses 24, thus enhancing the transfer or conduction of heat from extended areas of the cold plate 22 to the modules 25. The use of the ribs 40 provides a more even heat flow distribution throughout the surface of the cold plate 22. Generally these ribs 40 are of a triangular, elongated, tapered configuration having radii at the junction 40a with the cold plate 22, at the apex 40b of the triangle and at the junction 40c with the bosses 24.

As described above, the cold plate 22 is provided with its own fan 41 mounted in the center thereof within the space defined by the fin ends 23c for circulating the air within the insulated enclosure 21 to bring the heat from all parts of the enclosure 21 to the cold plate 22.

Figure 7:
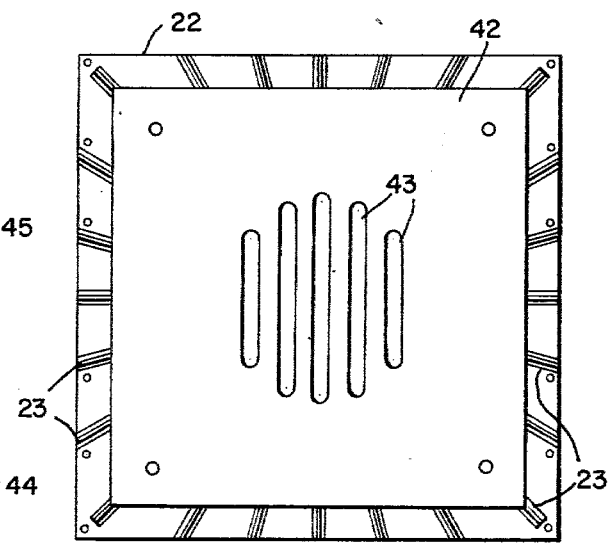
FIG. 7 is a rear view of the refrigeration unit.

Referring now to FIG. 7, a baffle plate 42 is mounted on the cold plate 22 to control the flow of the air so that it enters at the perimeter of the cold plate 22, passes along the fins 23, and exists at the center of the cold plate 22 through openings of louvers 43 provided in the baffle plate 42. The baffle plate 42 is slightly smaller in outside dimensions than the cold plate 22 so that the icebox conversion unit 20 may be recessed into the wall of an insulated enclosure 21, if desired, or placed adjacent to any object and still have air flow in at the perimeter of the cold plate 22 and along the fins 23. The size and shape of the openings or louvers 43 is selected to control the air flow such that the most efficient thermal transfer takes place.

Figure 8:
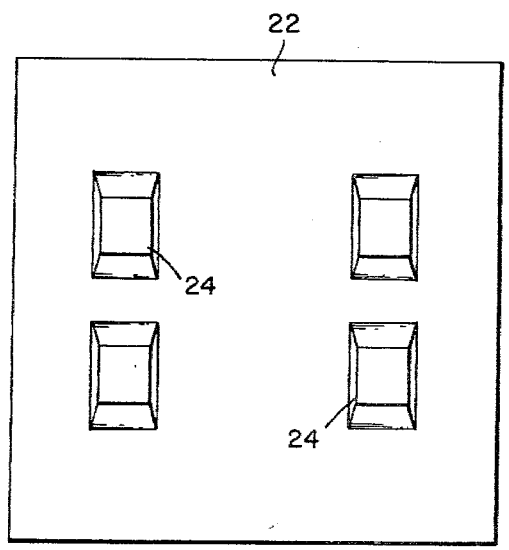
FIG. 8 is a front view of a modified cold plate, similar to that shown in FIG. 3, but useful for obtaining twice the cooling rate thereof.

An important feature of the icebox conversion unit 20 of the present invention is that, in a modification thereof, it may be provided with four thermoelectric modules 25 instead of two, which permits obtaining twice as much cooling in the same size case. Such an embodiment of the invention is shown in FIGS. 8-11. The cold plate 22 is provided with four bosses 24 symmetrically disposed thereon, although symmetry is not a critical part of the invention. This is best seen in FIG. 8. Thus, the addition of the two extra bosses 24 is the only modification necessary in the cold plate 22.

Figure 10:
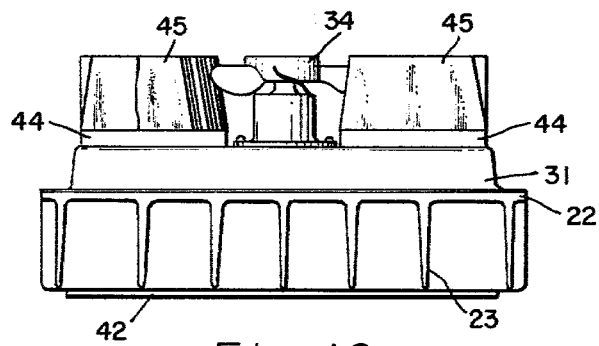
FIGS. 9 and 10 respectively are rear and top views of the embodiment illustrated in FIG. 8.
Figure 9:
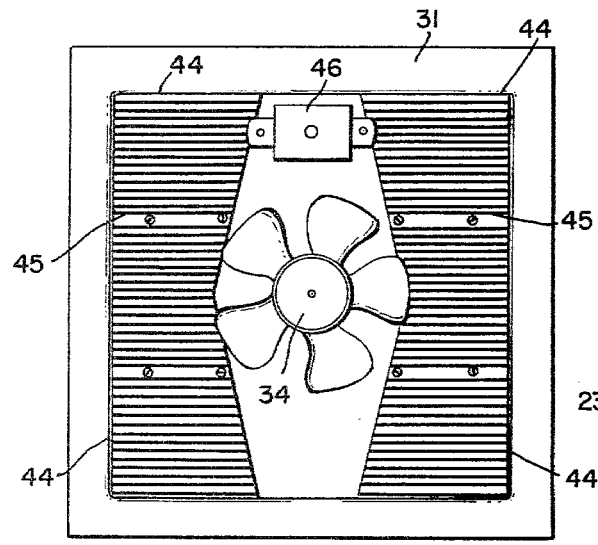

On the hot side of the thermoelectric modules 25, four heat sink plates 44 having heat radiating fins 45 are provided. The heat radiating fins 45 are tapered both vertically and horizontally, as indicated in FIGS. 9 and 10, to provide the maximum heat radiation area, while at the same time providing clearance for the fan 34. The location of the temperature control thermostat 46 may be seen in FIG. 9, and its control knob 47 may be seen in FIG. 11.

The cover 48 on the four-module unit is modified so as to provide ducts 50, 51. These ducts 50, 51 are provided with integral baffles 52, which direct the air flow from the heat radiating fins 45 away from the fan 34, which prevents mixing of the heated exit air with the cool incoming air, thus increasing the efficiency of the unit, and contributing to the ability of the four-unit configuration to provide twice as much cooling in the same size package.

Figure 11:
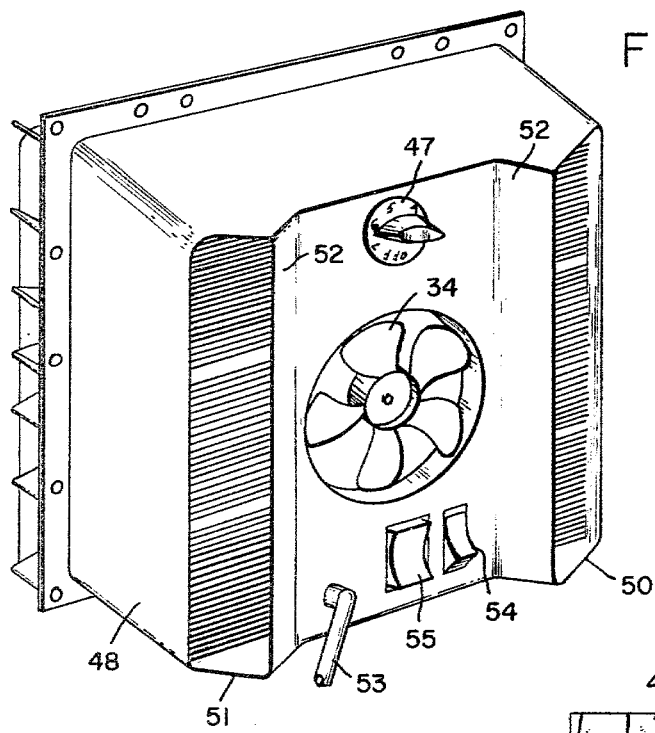
FIG. 11 is a perspective view of the front of the embodiment shown in FIGS. 8-10.

The power cord 53, on/off switch 54 and the 12/24 volt switch 55 may be seen in FIG. 11. This unit employing four thermoelectric modules 25 has the advantage of being able to be used on 24 volts, as in aircraft or heavy duty vehicles, without the use of any additional power supply components.

To install the icebox conversion unit 20, a hole of the proper size is cut in an existing insulated enclosure 21, and the unit 20 is mounted in the hole from the inside by means of four screws which pass through the cold plate 22 at margin 22a and the flanges 31b and 35a of the separator 31 and the cover 35 into the wall of the insulated enclosure 21. The entire unit 20 is simple, compact and self-contained, and easily fits inside the insulated enclosure 21. It can be easily installed by an unskilled person. The refrigeration unit is inexpensive to buy, economical to operate and silent in operation. It is not sensitive to motion, and does not need to be oriented with any particular side up. It may be mounted in the top, bottom or any side of any insulated enclosure.

Thus, there has been described an improved thermoelectric refrigeration unit suitable for use as an icebox conversion unit in any thermally insulated enclosure such as an icebox, ice chest, or the like. The object in any thermoelectric refrigeration unit is to achieve high thermal efficiency by insulating the assemblies on the hot side of the thermoelectric modules from the assemblies on the cold side thereof as effectively as possible, while at the same time collecting heat from the interior of the insulated enclosure, coupling it to the cold plate, conducting it along the thermal path to the modules, and emitting it to the ambient air with as little thermal loss and inefficiency as possible.

The unusually high thermal efficiency attained by the improved thermoelectric refrigeration unit of the present invention is due to the care which is taken to eliminate or minimize a large number of thermal losses or inefficiencies which cumulatively cooperate to degrade the performance of the unit as a whole. These measures include the use of bosses to space the cold plate assembly away from the heat sink plate assembly, the use of pour-in-place foam insulation to provide thermal insulation, while preventing condensation on the cold plate, the use of torqued, long, clamping, or compression screws isolated from the heat sink plate by clearance holes and fiber washers, and isolated from the bosses by clearance recesses in the sides thereof, the use of two side-by-side heat sink plates instead of a single, unitary heat sink plate, and the use of thermal epoxy and thermal grease to provide good thermal joints.

Much of the high thermal efficiency of the refrigeration unit of the present invention is made possible by the improved cold plate and its associated elements which, in combination, form the cold plate assembly. The cold plate, fins and bosses are diecast as one integral unit to eliminate unnecessary thermal junctions. The bosses are tapered from a small dimension at the modules to a large dimension at the cold plate. Sharp discontinuities in the thermal paths are avoided by using tapering, gradual curvature and radii in the configuration of the bosses and fins. The radial fins are so disposed to act as thermal collectors or heat absorbing ribs which provide efficient collection of heat from the air in the interior of the insulated enclosure, and efficient coupling and distribution of the heat to the cold plate. The cold plate fan and louvered baffle provide air flow entering the perimeter of the cold plate, traveling along the fins, and exiting at the center of the cold plate.

A two module refrigeration unit has been constructed in accordance with the present invention and weighs 10 lbs. and its size is 10"×10"×5". Current drain when operating on 12 volts DC is approximately 3.8 amperes, and when operating on 115 volts AC it is approximately 0.6 amperes. The unit mounts in a hole 8-⅝" wide and 8-⅞" high. The two module unit cools a 5 cubic foot or smaller fully insulated ice chest, and causes freezing in a 2 cubic foot or smaller ice chest.

In a modified embodiment of the invention, four thermoelectric units, four bosses and four heat sink plates are provided, and the front cover is provided with ducts and baffles to prevent mixing of heated air with cool air. A four module refrigeration unit was constructed, and it produced twice as much cooling in the same size package. Current drain when operating on 24 volts is approximately 3.8 amperes.

Another modification of the refrigeration unit of the present invention is the provision of thermal transfer ribs extending outward along the cold plate from the bosses. Such thermal transfer ribs collect heat from areas of the cold plate distant from the bosses and, in addition, provide a more even heat flow distribution throughout the surface of the cold plate.

It is to be understood that the above-described embodiments of the invention are merely illustrative of the many possible specific embodiments which represent applications of the principles of the present invention. Numerous and varied other arrangements may be readily devised in accordance with these principles by those skilled in the art without departing from the spirit and scope of the invention.

What is claimed is:

1. A thermoelectric refrigeration unit adapted for installation in an existing thermally insulated enclosure having an opening therein comprising:

a cold plate adapted to be secured to said enclosure in the opening, said cold plate having heat absorbing fins on one side thereof and facing inwardly of said enclosure, and means defining at least one boss on the other side thereof facing outwardly of said enclosure, said heat absorbing fins radially extending outwardly from a generally central space;

a fan mounted on said cold plate within the central space;

a baffle plate secured to said heat absorbing fins and having louvers therein generally positioned over said fan, whereby said fan moves air from said enclosure, past said heat absorbing fins and out through said louvers back into said enclosure;

a heat sink plate with heat radiating fins on one side thereof facing outwardly of said enclosure;

means defining at least one thermoelectric module disposed between said plates and cemented to said heat sink plate with a thermally conductive epoxy cement, and module means being thermally joined to said boss means with a thin continuous film of a thermally conductive grease;

a plurality of screws extending from said heat sink plate to said cold plate and compressing said module therebetween, said screws extending through thermally insulating washers, clearance holes in said heat sink plate, relief grooves in the sides of said boss means, and being threaded into said cold plate;

a pour-in-place polyurethane foam thermal insulation material disposed between said plates to substantially completely fill the space therebetween;

a dished separator disposed substantially to enclose the space between said plates, said separator having a flange secured to the edge of said cold plate, said separator extending to cover said insulation material and pass beneath said heat sink plate, said separator having an opening to accommodate said module;

a second fan mounted on said dished separator adjacent said heat radiating fins of said heat sink plate; and a cover nesting over said dished separator and enclosing said second fan, said heat sink plate and said heat radiating fins, said cover having a flange secured to said separator flange and opening over said second fan and said heat radiating fins to permit circulation of air therethrough.

2. A thermoelectric refrigeration unit according to claim 1 in which said cold plate, said heat absorbing fins and said boss means comprise an integrally formed unitary structure with curved portions between said heat absorbing fins and said cold plate and between said boss means and said cold plate for minimizing resistance to flow of heat.

3. A thermoelectric refrigeration unit according to claim 2 further including thermal transfer ribs formed integrally with said unitary structure and extending outwardly from said boss means to areas on said plate distant from said boss means for enhancing heat conduction from the areas to said module means.

4. A thermoelectric refrigeration unit according to claim 2 in which said boss means comprises a multiplicity of bosses and said module means comprises a plurality of thermoelectric modules thermally joined respectively to said bosses.

* * * * *